(12) United States Patent
Scheuerlein et al.

(10) Patent No.: US 7,542,338 B2
(45) Date of Patent: *Jun. 2, 2009

(54) METHOD FOR READING A MULTI-LEVEL PASSIVE ELEMENT MEMORY CELL ARRAY

(75) Inventors: Roy E. Scheuerlein, Cupertino, CA (US); Tyler J. Thorp, Sunnyvale, CA (US); Luca G. Fasoli, San Jose, CA (US)

(73) Assignee: SanDisk 3D LLC, Milpitas, CA (US)

( * ) Notice: Subject to any disclaimer, the term of this patent is extended or adjusted under 35 U.S.C. 154(b) by 262 days.

This patent is subject to a terminal disclaimer.

(21) Appl. No.: 11/461,367

(22) Filed: Jul. 31, 2006

(65) Prior Publication Data

US 2008/0025089 A1   Jan. 31, 2008

(51) Int. Cl.
 *G11C 16/04* (2006.01)
(52) U.S. Cl. .................................. 365/185.03
(58) Field of Classification Search ............. 365/185.03
 See application file for complete search history.

(56) References Cited

U.S. PATENT DOCUMENTS

| | | | |
|---|---|---|---|
| 2,632,058 A * | 3/1953 | Gray | 375/242 |
| 3,761,896 A | 9/1973 | Davidson | |
| 5,541,869 A | 7/1996 | Rose et al. | |
| 5,666,304 A | 9/1997 | Hikawa et al. | |
| 5,915,167 A | 6/1999 | Leedy | |
| 6,034,882 A | 3/2000 | Johnson et al. | |
| 6,072,716 A | 6/2000 | Jacobson et al. | |
| 6,385,074 B1 | 5/2002 | Johnson et al. | |
| 6,420,215 B1 | 7/2002 | Knall et al. | |
| 6,473,332 B1 | 10/2002 | Ignatiev et al. | |
| 6,490,218 B1 | 12/2002 | Vyvoda et al. | |
| 6,525,953 B1 | 2/2003 | Johnson | |
| 6,545,898 B1 | 4/2003 | Scheuerlein | |
| 6,618,295 B2 | 9/2003 | Scheuerlein | |
| 6,711,068 B2 | 3/2004 | Subramanian et al. | |

(Continued)

OTHER PUBLICATIONS

Byeon, D. et al., "An 8Gb Multi-Level NAND Flash Memory with 63nm STI CMOS Process Technology", ISSCC Session 2 Non-Volatile Memory 2.2, IEEE International Solid-State Circuits Conference, Feb. 2005, 5 pages.

(Continued)

*Primary Examiner*—Anh Phung
*Assistant Examiner*—Harry W Byrne
(74) *Attorney, Agent, or Firm*—Zagorin O'Brien Graham LLP

(57) ABSTRACT

A four level passive element cell has memory states corresponding to decreasing resistance levels, which are preferably mapped respectively to data states 11, 01, 00, and 10. The LSB and MSB are preferably mapped as part of different pages. To discriminate between memory cell states, the selected bit line current is sensed for at least two different combinations of reference current level and read bias voltage. A mid-level reference is used to read the LSB. When reading the MSB, a first reference between the 10 and 00 data states, and a second reference between 01 and 11 data states may be used, and the mid-level reference need not be used. In certain embodiments, the bit line current may be simultaneously compared against the first and second references, without requiring a delay to stabilize the bit line current to a different value, and the MSB generated accordingly.

34 Claims, 6 Drawing Sheets

U.S. PATENT DOCUMENTS

| | | | |
|---|---|---|---|
| 6,735,104 | B2 | 5/2004 | Scheuerlein |
| 6,753,561 | B1 | 6/2004 | Rinerson et al. |
| 6,795,340 | B2 | 9/2004 | Sakimura et al. |
| 6,801,448 | B2 | 10/2004 | Hsu |
| 6,831,854 | B2 | 12/2004 | Rinerson et al. |
| 6,834,008 | B2 | 12/2004 | Rinerson et al. |
| 6,841,833 | B2 | 1/2005 | Hsu et al. |
| 6,850,429 | B2 | 2/2005 | Rinerson et al. |
| 6,856,536 | B2 | 2/2005 | Rinerson et al. |
| 6,856,572 | B2 | 2/2005 | Scheuerlein et al. |
| 6,859,382 | B2 | 2/2005 | Rinerson et al. |
| 6,859,410 | B2 | 2/2005 | Scheuerlein et al. |
| 6,879,505 | B2 | 4/2005 | Scheuerlein |
| 6,881,623 | B2 | 4/2005 | Campbell et al. |
| 6,906,939 | B2 | 6/2005 | Rinerson et al. |
| 6,909,632 | B2 | 6/2005 | Rinerson et al. |
| 6,917,539 | B2 | 7/2005 | Rinerson et al. |
| 6,927,411 | B2 | 8/2005 | Kozicki |
| 6,952,030 | B2 | 10/2005 | Herner et al. |
| 6,965,137 | B2 | 11/2005 | Kinney et al. |
| 7,038,935 | B2 | 5/2006 | Rinerson et al. |
| 7,057,922 | B2 | 6/2006 | Fukumoto |
| 7,106,652 | B2 | 9/2006 | Scheuerlein |
| 7,142,471 | B2 | 11/2006 | Fasoli et al. |
| 7,177,181 | B1 | 2/2007 | Scheuerlein |
| 7,233,024 | B2 | 6/2007 | Scheuerlein et al. |
| 7,298,665 | B2 | 11/2007 | So et al. |
| 2003/0021148 | A1 | 1/2003 | Scheuerlein |
| 2003/0047765 | A1 | 3/2003 | Campbell |
| 2003/0053332 | A1* | 3/2003 | Kleveland et al. ...... 365/185.03 |
| 2005/0201148 | A1 | 9/2005 | Chen et al. |
| 2005/0276091 | A1* | 12/2005 | Inoue .................... 365/148 |
| 2006/0146639 | A1 | 7/2006 | Fasoli et al. |
| 2006/0250836 | A1 | 11/2006 | Herner et al. |
| 2006/0250837 | A1 | 11/2006 | Herner et al. |
| 2006/0273298 | A1 | 12/2006 | Petti |
| 2007/0007579 | A1 | 1/2007 | Scheuerlein et al. |
| 2007/0008773 | A1 | 1/2007 | Scheuerlein |
| 2007/0008785 | A1 | 1/2007 | Scheuerlein |
| 2007/0008786 | A1 | 1/2007 | Scheuerlein |
| 2007/0069276 | A1 | 3/2007 | Scheuerlein et al. |
| 2007/0072360 | A1 | 3/2007 | Kumar et al. |
| 2007/0090425 | A1 | 4/2007 | Kumar et al. |
| 2007/0236981 | A1 | 10/2007 | Herner |
| 2008/0023790 | A1 | 1/2008 | Scheuerlein |
| 2008/0025061 | A1 | 1/2008 | Scheuerlein et al. |
| 2008/0025066 | A1 | 1/2008 | Fasoli et al. |
| 2008/0025068 | A1 | 1/2008 | Scheuerlein et al. |
| 2008/0025069 | A1 | 1/2008 | Scheuerlein et al. |
| 2008/0025088 | A1 | 1/2008 | Scheuerlein et al. |

OTHER PUBLICATIONS

Lee, Seungjae et al., "A 3.3V 4Gb Four-Level NAND Flash Memory with 90nm CMOS Technology", IEEE Int'l Solid-State Circuits Conference, 2004, Non-Volatile Memory/2.7, Feb. 2004, 13 pages.

International Search Report and Written Opinion for PCT App. No. PCT/US07/74899, mailed Oct. 28, 2008 (9 pages).

* cited by examiner

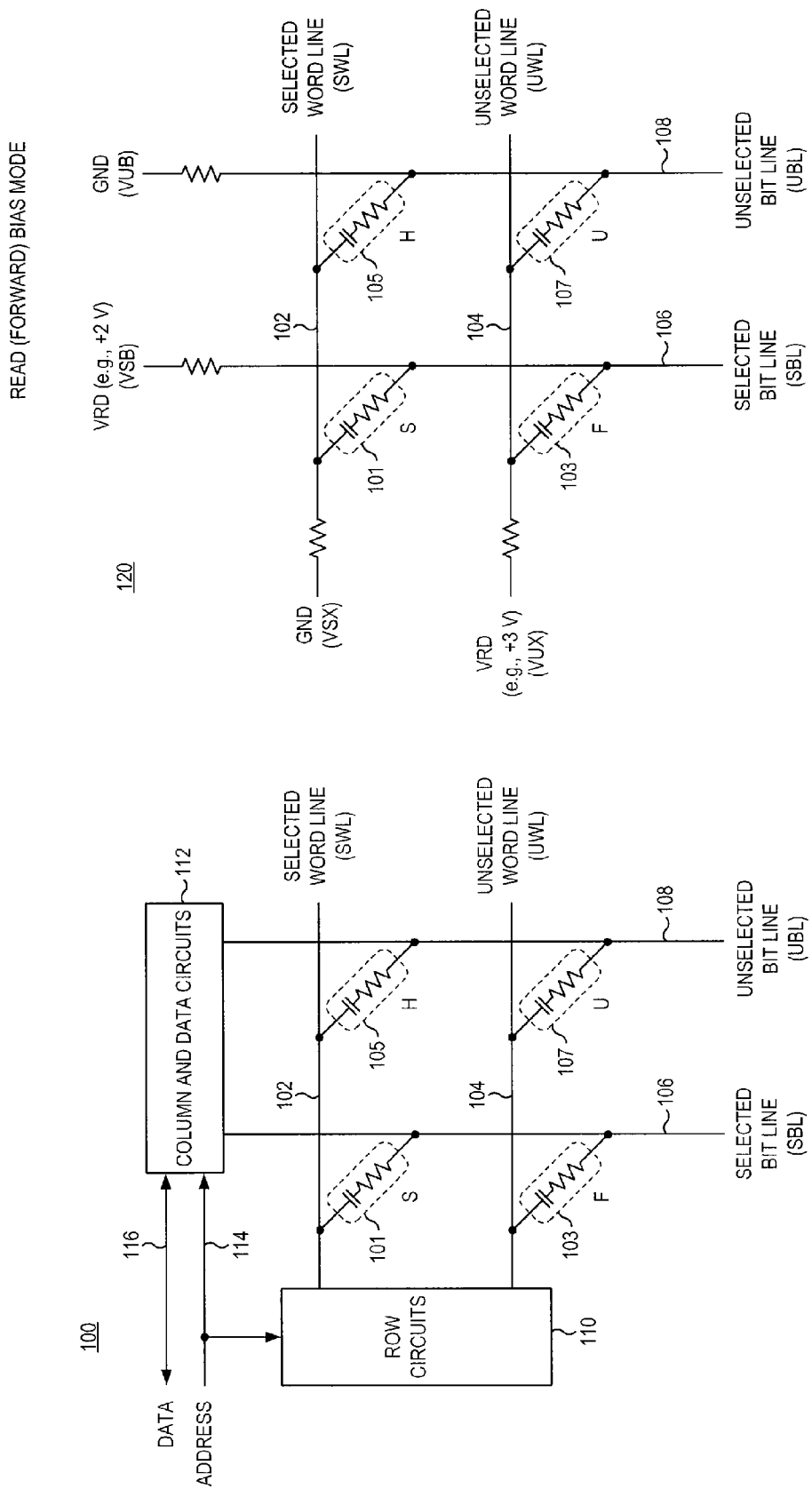

INCREASING RESISTANCE →

← LSB=0 | LSB=1 →

Ref2

190 (10) — 192 (00) — 194 (01) — 196 (11)

MSB=1 | MSB=0 | MSB=1

Ref3 | Ref1

← INCREASING CONDUCTANCE

ORDER OF PROGRAMMING AND ASSIGNMENT OF DATA STATES

INITIAL PROGRAMMING OPERATION (FOR LSB) — 182

184 — MSB PROGRAMMING

186

INCREASING RESISTANCE →

190 (10) — 192 (00) — 194 (01) — 196 (11)

INITIAL STATE (HIGHEST RESISTANCE)

METHOD FOR READING A MULTI-LEVEL PASSIVE ELEMENT MEMORY CELL ARRAY

CROSS-REFERENCE TO RELATED APPLICATION(S)

This application discloses subject matter that is also disclosed in the following co-pending U.S. patent application(s), each filed on even date herewith, and each of which is hereby incorporated by reference in its entirety:

U.S. application Ser. No. 11/461,343 entitled "Apparatus for Reading a Multi-Level Passive Element Memory Cell Array" by Roy E. Scheuerlein, Tyler J. Thorp, and Luca G. Fasoli.

BACKGROUND

1. Field of the Invention

The present invention relates to semiconductor integrated circuits containing programmable multi-level memory cell arrays, and particularly those arrays incorporating passive element memory cells, and more particularly those having a three-dimensional memory array.

2. Description of the Related Art

Writing and reading memory cells with more than two levels stored in each cell leads to performance penalties because multiple write cycles and multiple read cycles are required. In 3D passive element arrays this is a particular problem because of the other performance limitations in these arrays.

Other multi-level memory cells have been described, particularly three-terminal devices having a charge storage layer such as a floating gate. In these devices the gate terminal of the memory cell is usually coupled to a word line, and the various memory states are read by application of different voltages on the word line. At each such word line voltage, a current flows on the bit line if the word line voltage is above the programmed threshold voltage, and is sensed.

Certain passive element memory cells exhibit re-writable characteristics. For example, in certain memory cells programming may be achieved by forwarding biasing the memory cell (e.g., with reference to the polarity of a diode therewithin) with a voltage of approximately 6-8V, while erase may be achieved by reverse biasing the memory cell with a voltage of approximately 10-14V.

SUMMARY

In a four level passive element cell having a least significant bit (LSB) and a most significant bit (MSB), one would traditionally have to sense at three exponentially stepped current (i.e., Iref) levels to distinguish between the four states. Between each such sensing operation, there is a necessary delay to stabilize the current level on the bit line (which is typically a highly capacitively loaded node), so three long read cycles are likely required.

In contrast, the LSB may be mapped as part of one page, and the MSB mapped as part of another page. Also the data states may be assigned in a gray scale, in which the highest resistance state (i.e., "un-popped" state) is assigned the 11 state, and the lowest resistance state (i.e., "popped" state) is assigned the 10 state. As a result, only a mid-level read reference is needed to read the LSB. The state assignments for the other two data states may be chosen so that the mid-level read reference for the LSB is independent of the MSB. Preferably, the other two data states have a resistance between the "popped" 10 state and the "unpopped" 11 state, with the data state closer to the "popped" 10 state being assigned the 00 state, and the data state closer to the "un-popped" 11 state being assigned the 01 state. When reading the MSB, a first reference between the 10 and 00 data states, and a second reference between 01 and 11 data states may be used, and the mid-level reference need not be used.

In general, the invention is directed to a method for reading a multi-level passive element memory cell array. However, the invention is defined by the appended claims, and nothing in this section shall be taken as limiting those claims.

In one aspect, the invention provides a method for reading a multi-level passive element memory cell having first, second, third, and fourth memory cell states corresponding respectively to first, second, third, and fourth decreasing resistance levels. The method includes discriminating between memory cell states by sensing current on a selected bit line for at least two different combinations of reference current level and read bias voltage on the selected bit line.

In another aspect, the invention provides a method for reading a multi-level passive element memory cell having first, second, third, and fourth memory cell states corresponding respectively to first, second, third, and fourth decreasing resistance levels. The method includes biasing a selected bit line with a read bias voltage, biasing a selected word line with a selected word line voltage, generating a first signal and a second signal indicative respectively of a current on the selected bit line relative to a first reference current level and relative to a second reference current level, and generating a read data value for a first data bit as a function of the first and second signals.

In another aspect, the invention provides a method for reading a multi-level passive element memory cell having first, second, third, and fourth memory cell states corresponding respectively to first, second, third, and fourth decreasing resistance levels. The method includes (a) biasing a selected word line with a selected word line voltage; (b) biasing a selected bit line with a first read bias voltage; (c) generating a first signal indicative of the current on the selected bit line, when biased at the first read bias voltage, relative to a first reference current level; (d) biasing the selected bit line with a second read bias voltage; (e) generating a second signal indicative of the current on the selected bit line, when biased at the second read bias voltage, relative to a second reference current level; and (f) determining a read data value for a first data bit as a function of the first and second signals.

In yet another aspect, the invention provides a method for making a memory product. The method includes forming a memory array comprising multi-level passive element memory cells having first, second, third, and fourth memory cell states corresponding respectively to first, second, third, and fourth decreasing resistance levels. The method further includes forming a data circuit configured to discriminate between memory cell states by sensing current on a selected bit line for at least two different combinations of reference current level and read bias voltage on the selected bit line.

The invention in several aspects is suitable for integrated circuits having a memory array, for methods for operating such integrated circuits and memory arrays, for systems and devices incorporating such integrated circuits and memory arrays, and for computer readable media encodings of such systems, devices, integrated circuits, or memory arrays, all as described herein in greater detail and as set forth in the appended claims. The described techniques, structures, and methods may be used alone or in combination.

The foregoing is a summary and thus contains, by necessity, simplifications, generalizations and omissions of detail. Consequently, those skilled in the art will appreciate that the foregoing summary is illustrative only and that it is not intended to be in any way limiting of the invention. Other aspects, inventive features, and advantages of the present invention, as defined solely by the claims, may be apparent from the detailed description set forth below.

BRIEF DESCRIPTION OF THE DRAWINGS

The present invention may be better understood, and its numerous objects, features, and advantages made apparent to those skilled in the art by referencing the accompanying drawings.

FIG. 1 is a schematic diagram of a memory array, illustrating selected and unselected word lines and bit lines, and depicting row and column circuits coupled thereto.

FIG. 2 is a schematic diagram of the memory array depicted in FIG. 1, but illustrating exemplary bias conditions in a read mode of operation.

FIG. 5 is a diagram depicting an exemplary assignment of data states to four resistance levels of a memory cell, and an exemplary order of programming.

FIG. 6 is a diagram depicting an exemplary assignment of data states to four resistance levels of a memory cell, and exemplary sense current levels.

The use of the same reference symbols in different drawings indicates similar or identical items.

DESCRIPTION OF THE PREFERRED EMBODIMENT(S)

Figures 3, 4:
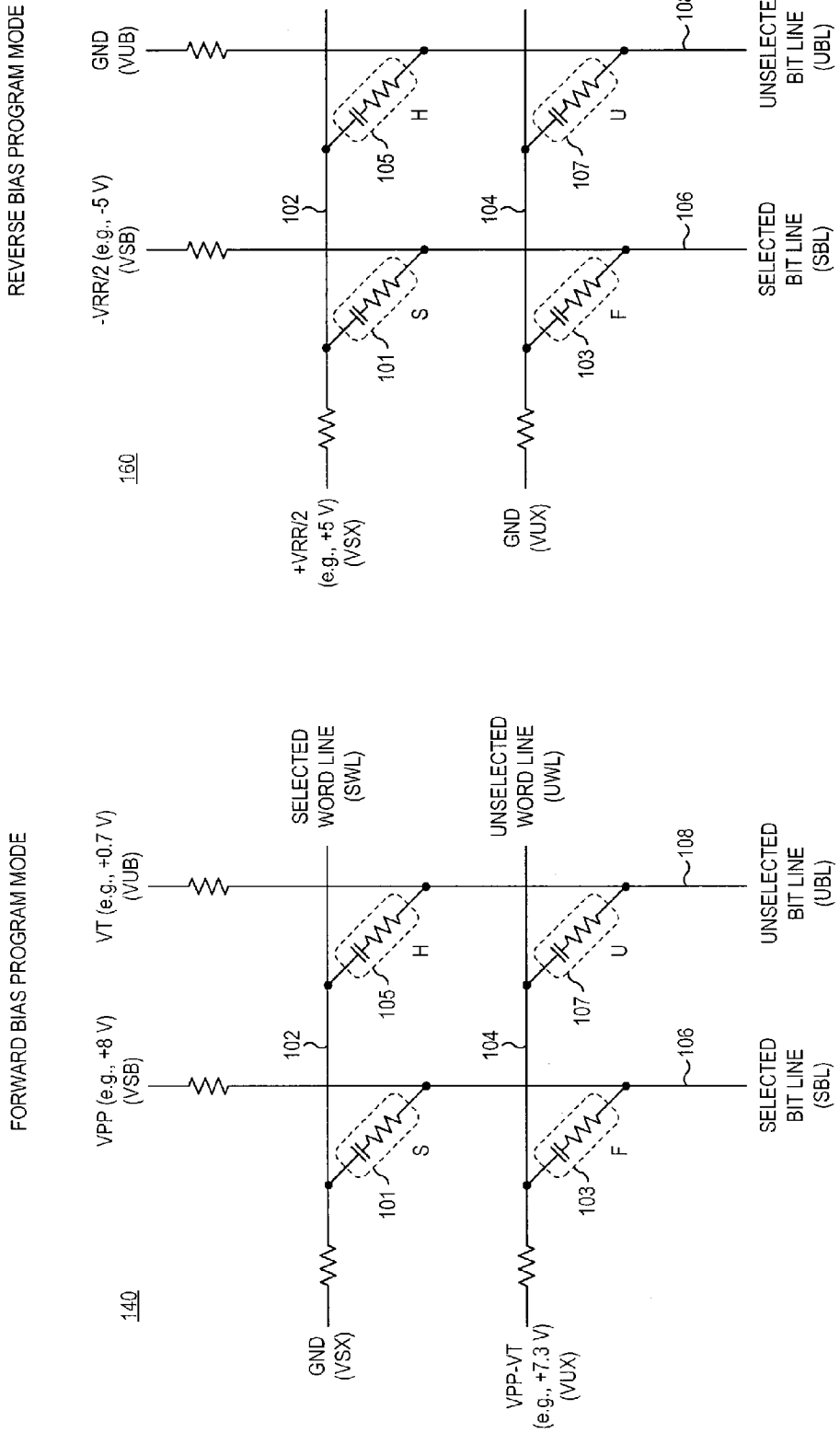
FIG. 3 is a schematic diagram of the memory array depicted in FIG. 1, illustrating exemplary word line and bit line bias conditions in a forward bias programming mode of operation.
FIG. 4 is a schematic diagram of the memory array depicted in FIG. 1, illustrating exemplary word line and bit line bias conditions in a reverse bias programming mode of operation.

FIG. 1 is a schematic diagram of an exemplary passive element memory array 100. Two word lines 102, 104 are shown, as well as two bit lines 106, 108. Word line 102 is assumed to be a selected word line (SWL), and word line 104 is assumed to be an unselected word line (UWL). Similarly, bit line 106 is assumed to be a selected bit line (SBL), and bit line 108 is assumed to be an unselected bit line (UBL). Four passive element memory cells 101, 103, 105, 107 are shown, each coupled between an associated word line and an associated bit line.

Memory cell 101 is associated with the selected word line 102 and the selected bit line 106, and may be viewed as an "S" cell (i.e., "selected" cell). Memory cell 103 is associated with the unselected word line 104 and the selected bit line 106, and may be viewed as an "F" cell (i.e., "off" cell). Memory cell 105 is associated with the selected word line 102 and the unselected bit line 108, and may be viewed as an "H" cell (i.e., "half-selected" cell). Lastly, memory cell 107 is associated with the unselected word line 104 and the unselected bit line 108, and may be viewed as a "U" cell (i.e., "unselected" cell).

The selected and unselected word lines are shown as being generated by a row circuits block 110, which includes a row decoder circuit. The selected and unselected bit lines are shown as being generated by a column and data circuits block 112, which includes a column decoder circuit and data input/output circuits. Both the row circuits 110 and the column and data circuits 112 are responsive to address information (i.e., ADDRESS signals) conveyed on bus 114, and the column and data circuits 112 are responsive to (and, at times, generate) data signals (i.e., DATA signals) conveyed on I/O bus 116. Such busses 114, 116 may be internal to an integrated circuit, or may represent system busses traversing integrated circuit boundaries and coupled to other integrated circuits.

Illustrated in FIG. 2 are exemplary general biasing conditions for a forward bias mode of operation useful for reading selected memory cell(s). As described elsewhere herein, such a forward bias mode may also be used for a programming mode, a block erase mode, in addition to a read mode (although usually with different voltage levels or conditions for such different modes). As shown, the bias conditions may be viewed as appropriate for a read mode of operation for a selected array block, and will be described as such.

The selected word line 102 is biased at a VSX voltage (e.g., ground), and the selected bit line 106 biased at a VSB voltage (e.g., +2 volts). This selected bit line bias voltage VSB may be viewed as the read voltage VRD, as substantially this entire voltage is impressed across the selected memory cell 101 (since the selected word line is biased at ground), less certain resistive drops in the busses and array lines themselves. The unselected word line 104 is biased at a VUX voltage equal to the read voltage VRD (e.g., +2 volts), and the unselected bit line 108 is biased at a VUB voltage equal to the selected word line voltage (e.g., ground).

Under these biasing conditions, the S cell 101 receives a forward bias voltage equal to VRD (e.g., +2 volts), while the F cell 103 and the H cell 105 receive no bias voltage, and the U cell 107 receives a reverse bias voltage equal to VRD (e.g., −2 volts). When biased under these conditions, the selected cell will generate a current on the selected bit line which may be detected, while the F and H cells contribute no current (having no bias thereacross), and the U cells contribute leakage currents between unselected word lines and bit lines.

Referring now to FIG. 3, exemplary biasing conditions are depicted for a forward bias programming mode of operation. The selected word line 102 is biased at a VSX voltage (e.g., ground), the selected bit line 106 is biased at a VSB voltage (e.g., +8 volts), the unselected word line 104 is biased at a VUX voltage (e.g., +7.3 volts), and the unselected bit line 108 is biased at a VUB voltage (e.g., +0.7 volts). The selected bit line bias voltage VSB now may be viewed as the programming voltage VPP, as substantially this entire voltage is impressed across the selected memory cell 101 (since the selected word line is biased at ground), less certain resistive drops in the busses and array lines themselves. The unselected bit line bias voltage VUB is preferably set at the apparent "threshold voltage" in a forward biased direction of each memory cell, and is thus shown as a voltage VT being impressed on the unselected bit line 108. Similarly, the unselected word line bias voltage VUX is also preferably set at a value of VPP−VT.

Under these biasing conditions, the S cell 101 receives a forward bias voltage equal to VPP (e.g., +8 volts), the F cell 103 receives a forward bias voltage equal to VT (e.g., +0.7 volts), the H cell 105 receives a forward bias voltage equal to VT (e.g., +0.7 volts), and the U cell 107 receives a reverse bias voltage equal to VPP −2VT (e.g., −6.6 volts). There are several exemplary memory cell technologies that, when biased under these conditions, the selected cell will be changed to a lower value of resistance, while the F, H, and U cells will not appreciably change in resistance.

Referring now to FIG. 4, exemplary biasing conditions 200 are shown for a reverse bias mode of operation. As described elsewhere herein, such a reverse bias mode may be used for a programming mode or a block erase mode (although usually with different conditions for such different modes). As shown, the bias conditions may be viewed as appropriate for either a programming mode or erase mode of operation for a selected array block, and will be described as such.

Each of the bias conditions VSX, VUX, VSB, and VUB are now redefined for values appropriate for the present mode of operation. The selected word line 102 is biased at a VSX voltage of VRR/2 (e.g., +5 volts), and the selected bit line 106 biased at a VSB voltage of −VRR/2 (e.g., −5 volts). The unselected word line voltage VUX and the unselected bit line voltage VUB are both ground.

Under these biasing conditions, the S cell 101 receives a reverse bias voltage equal in magnitude to VRR (e.g., −10 volts), the F cell 103 receives a reverse bias voltage equal to VRR/2 (e.g., −5 volts), and the H cell 105 receives a reverse bias voltage equal to VRR/2 (e.g., −5 volts). Of note, the U cell 107 receives no bias across the cell.

There are several exemplary memory cell technologies (described below) that, when biased under these conditions, the selected cell will be changed from a lower value of resistance to a higher value of resistance, while the F, H, and U cells will not appreciably change in resistance. It should also be noted that the unselected U memory cells, which otherwise may support a considerable amount of leakage current when biased with several volts across such a cell, have no bias and therefore no leakage current. As will be described in further detail, many useful memory array embodiments include a far larger number of U cells than H cells of F cells, and such arrays will have significantly less leakage current in the unselected memory cells of the array, and hence much less power dissipation, than with other biasing schemes.

In FIG. 5, an exemplary assignment of data states is depicted by diagram 180 for an exemplary multi-level passive element memory cell, along with a preferred order of programming such a memory cell to these data states. From left to right, data states 190, 192, 194, and 196 represent increasing resistance of the memory cell. Data state 196 represents an initial "un-popped" state of the memory cell, and has the highest value of resistance of the four data states. This data state 196 is preferably assigned to data "11" (i.e., MSB=1, LSB=1). The lowest resistance data state 190 is preferably assigned to data "10" (i.e., MSB=1, LSB=0). The initial programming operation, here represented by transition 182, changes the memory cell to a "popped" state, and results in the data state 190, or the "10" data state. Such programming to "pop" the memory cell may be accomplished using a forward bias programming mode of operation. The memory cell may be further programmed into either of the remaining two data states 192, 194, here represented respectively by transitions 186, 184, by a reverse bias mode of operation which increases the resistance of the memory cell. Such forward bias and reverse bias programming modes are further described elsewhere herein (including other descriptive material incorporated herein by reference).

The initial programming operation may be viewed as programming the LSB, while the second programming operation may be viewed as programming the MSB while preserving the LSB. The LSB and MSB are preferably mapped to separate pages of the memory, as described in regards to reading such memory cell described below. In preferred embodiments, the LSB data is programmed before the MSB page, and the LSB page is read before determining the programming conditions for the MSB data.

Referring now to FIG. 6, a depiction 198 is shown of reference levels that may be used to distinguish between the various data states. With the data assignments as shown, the LSB may be determined using a single mid-level reference, here shown as Ref2. If the resistance of the memory cell is determined to be higher than this Ref2 level, the LSB=1. Conversely, if the resistance is lower than this Ref2 level, the LSB=0.

The MSB may be determined using two reference levels Ref1, Ref3. The Ref1 level is between the 01 and 11 states, and the Ref3 level is between the 10 and 00 states. The mid-level reference Ref2 is not used. If the resistance of the memory cell is determined to be "inside" or between the two reference levels (i.e., higher than the Ref3 level and lower than the Ref1 level), the MSB=0. Conversely, if the resistance is "outside" the two reference levels (i.e., lower than the Ref3 level or higher than the Ref1 level), the MSB=1.

One advantage of such a data state assignment is apparent if a multi-level memory cell is down-graded and used to store only a single bit of information in each memory cell, rather than, for example, two bits. In such a case, a single reference level may be used to determine the LSB. Moreover, the two data states actually used are the two states having the greatest difference in resistance, to give substantial margin to sensing between these two data states. This sensing method is advantageously used in some of the embodiments described in the 10519-149 and 10519-152 applications, referenced below.

Figure 7:
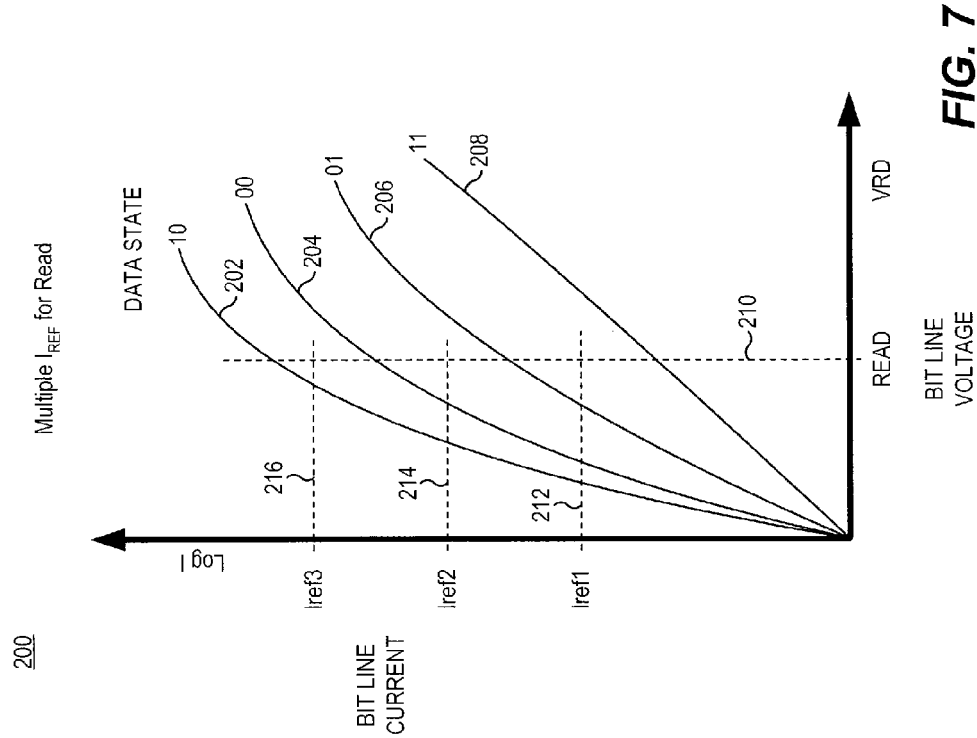
FIG. 7 is an I-V diagram depicting a read condition in accordance with certain embodiments of the present invention.

Referring now to FIG. 7, an I-V (i.e., current-voltage) graph 200 represents the current voltage relationship of an exemplary passive element memory cell. Four I-V curves 202, 204, 206, 208 are shown, corresponding respectively to data states 190, 192, 194, 196, and representing respectively data values 10, 00, 01, 11. As depicted in the graph, these four states may be determined using a single read voltage 210 (VRD) on the selected bit line, by comparing the current generated on the selected bit line against three different reference current levels Iref1 (212), Iref2 (214), Ire3 (216), which correspond respectively to the resistance reference levels Ref1, Ref2, Ref3, described above in reference to FIG. 6. In this technique, the voltage on the bit line is set to the VRD voltage, and the bit line current compared to one, two, or three reference current levels. Only one stabilization of the VRD voltage on the SBL is required, yet all four data states may be determined by proper choice of the three reference current levels 212, 214, 216. This method is particularly useful for memory cell currents on the order of 100 nA or more, in which case the magnitude of the Iref1 current may be approximately 100 nA.

Figure 8:
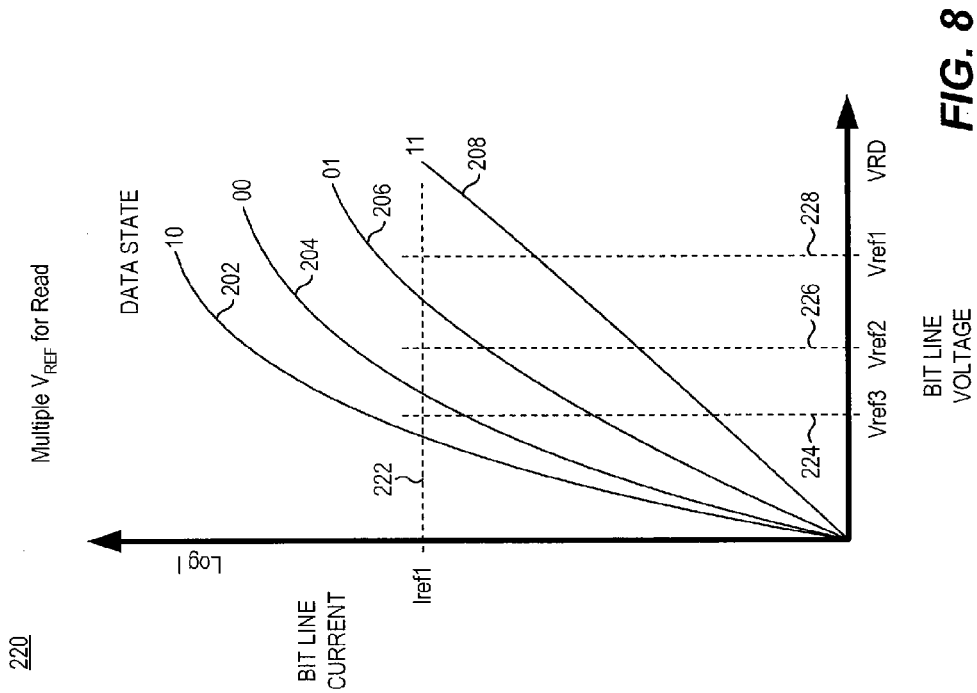
FIG. 8 is an I-V diagram depicting another read condition in accordance with certain embodiments of the present invention.

Referring now to FIG. 8, an I-V graph 220 represents another technique. As depicted in the graph, the four data states may be determined using a single read current 222 on the selected bit line, by comparing the current generated on the selected bit line against a single reference current Iref1, for three different read voltage levels Vref1 (228), Vref2 (226), Vref3 (224), which correspond respectively to the resistance reference levels Ref1, Ref2, Ref3, described above. In this technique, the voltage on the bit line is set to a read voltage VRD equal to one of the three reference voltages 224, 226, 228, and the bit line current compared to the reference current 222. Only one stabilization of the VRD voltage on the selected bit line is required to determine the LSB, although two stabilizations of the VRD voltage on the selected bit line are required to determine the MSB.

It is particularly advantageous if the values of the Vref1, Vref2, and Vref3 read voltages are manipulated so that a single bit line reference current may be used, which allows sense amplifier circuitry to be optimized for such a bias condition. This method may be particularly useful for memory cells having relatively low currents, such as well below 100 nA for the highest resistance state, because the current level for the high resistance state is set to a higher value than for the technique shown in FIG. 7 by shifting the VRD level to 2.5 volts or even higher. Bit line bias circuitry and sense amplifier circuitry may frequently be more easily optimized when using a higher value of bit line current.

Figure 9:
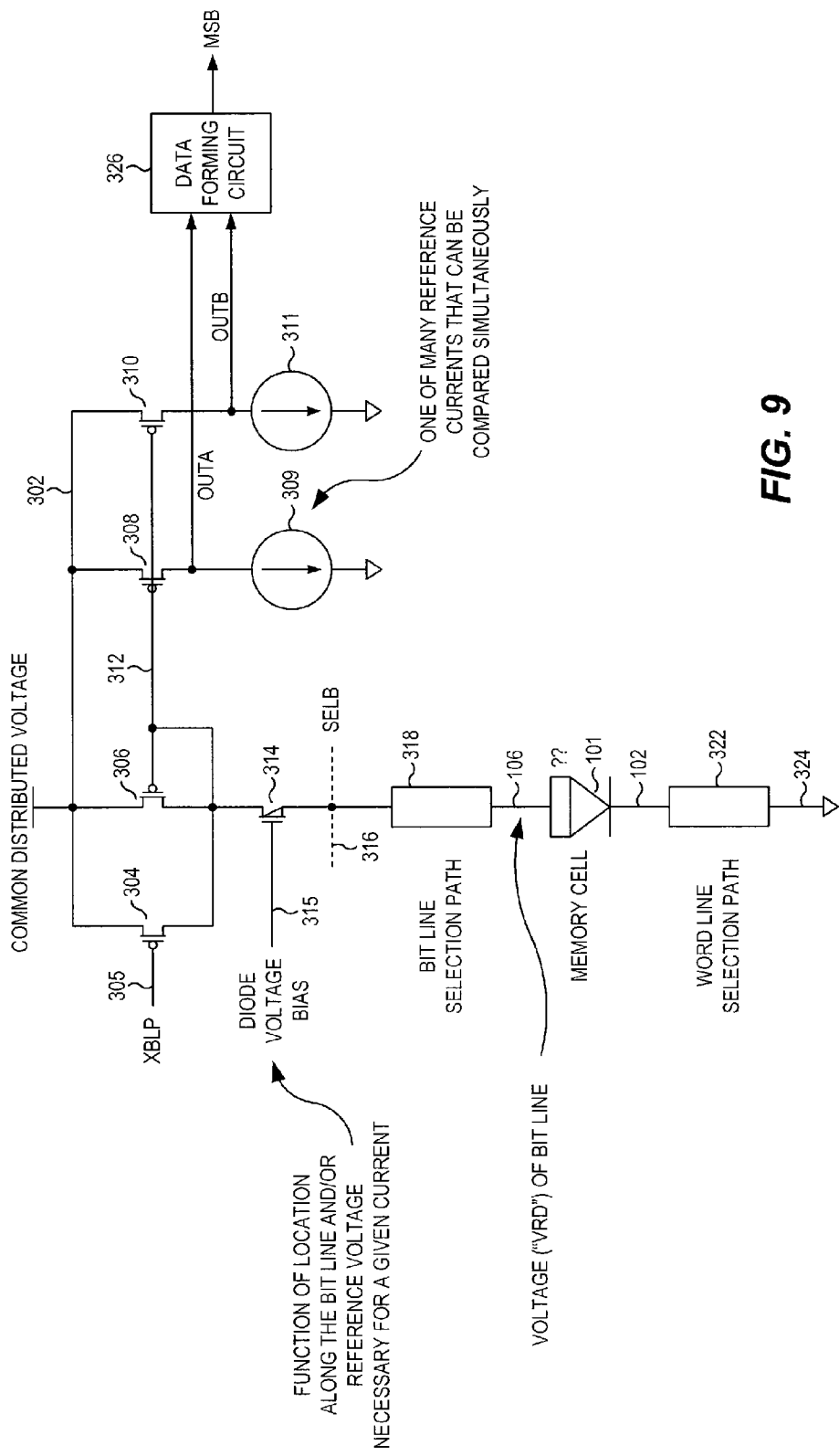
FIG. 9 is a schematic/block diagram of a read circuit, including a depiction of the path through a selected memory cell and the word line and bit line selection paths, in accordance with certain embodiments of the present invention.

Another preferred method for setting the references is not purely by Iref levels. Since the Icell varies exponentially over the distribution of cells due to the diode current variation, the three Iref levels will traverse a wide range. The sense amplifier may not be as ideally sensitive throughout the wide range of Iref. Therefore this method illustrated by FIG. 8 uses a higher Vref for the lowest reference and a lower Vref for the highest reference. All the comparison operations could use the same Iref value, so the Iref level does not have to change between the first read comparison and the second for faster read speed and less circuit complexity. The circuit of FIG. 9 is suitable for the technique illustrated by FIG. 8, where only one current comparison circuit 308 and 309 and OUTA is needed. The OUTB circuitry is not needed. In addition, with appropriate choice of the Vref levels the Iref can be the same for all three reads with the sensitivity of the sense amplifier as ideally designed as possible. The read operation is faster because at most two read cycles are required and Iref does not have to change between cycles as described above.

The methods of FIG. 7 and FIG. 8 may be combined by varying both the Iref and Vref for the three discrimination levels to produce the largest margin of error in the sensing process.

FIG. 9 depicts an exemplary circuit topology 300 for reading a multi-level memory cell, along with a representation of the word line and bit line selection paths to a selected memory cell 101. This circuit corresponds generally to the technique described in FIG. 7. A word line selection path 322 represents, for example, the path through a word line driver circuit (i.e., a decoder "head") and to a circuit for generating a decoded source selection bus for the decoder heads, to a ground voltage conveyed on node 324. A bit line selection path 318 represents the path through the bit line driver circuit and through any bus coupling circuits to the read circuit. An SELB data bus 316 represents the input to this read circuit. Additional details of useful decoding circuits are described in the 023-0048 and 023-0054 applications, in the 023-0051 and 023-0056 applications, and in the 023-0053 and 023-0058 applications, all referenced below.

The desired read voltage VRD on the selected bit line is provided by way of the clamp device 314 which receives a diode voltage bias signal 315 on its gate. Clamp device 314 is preferably a native threshold NMOS device. This bias signal 315 may vary as a function of the location of the selected memory cell along the bit line, and is adjusted to generate a desired read voltage VRD on the selected bit line (i.e., node 106). A precharge transistor 304 is used to precharge various nodes in this topology, including the selected bit line and decoding paths selecting such bit line, in response to an active-low precharge signal XBLP. After the voltages are established at or near the desired values, the precharge signal is removed, and a current mirror device 306 provides a current load for the selected bit line. The voltage developed on the current mirror gate node 312 is coupled to devices 308, 310 which mirror the bit line current (either with the same magnitude or scaled by the current mirror) to a pair of output stages, each having a respective current source 309, 311 for providing a high voltage gain output circuit which develops a respective output signal OUTA, OUTB. The circuit is powered by a common distributed voltage conveyed on node 302, which voltage is somewhat higher than the desired read voltage VRD.

This circuit provides for setting a desired read voltage on the selected bit line, and further provides for simultaneously comparing the selected bit line current against two different reference currents to generate two different output signals. The circuit simultaneously compares the Icell to multiple Iref currents, as shown by a first current comparator circuit comprising device 308 and current reference 309 and a second current comparator circuit comprising device 310 and current reference 311. OUTA and OUTB are used to determine the memory state as described in more detail above with reference to FIG. 6. These signals may be combined by a data forming circuit 326 to generate the MSB. A single stabilization time of this voltage on the selected bit line is sufficient. A single one of the OUTA and OUTB outputs can directly generate the LSB (e.g., using a different value of the reference current), with the other output not needed.

Figure 10:
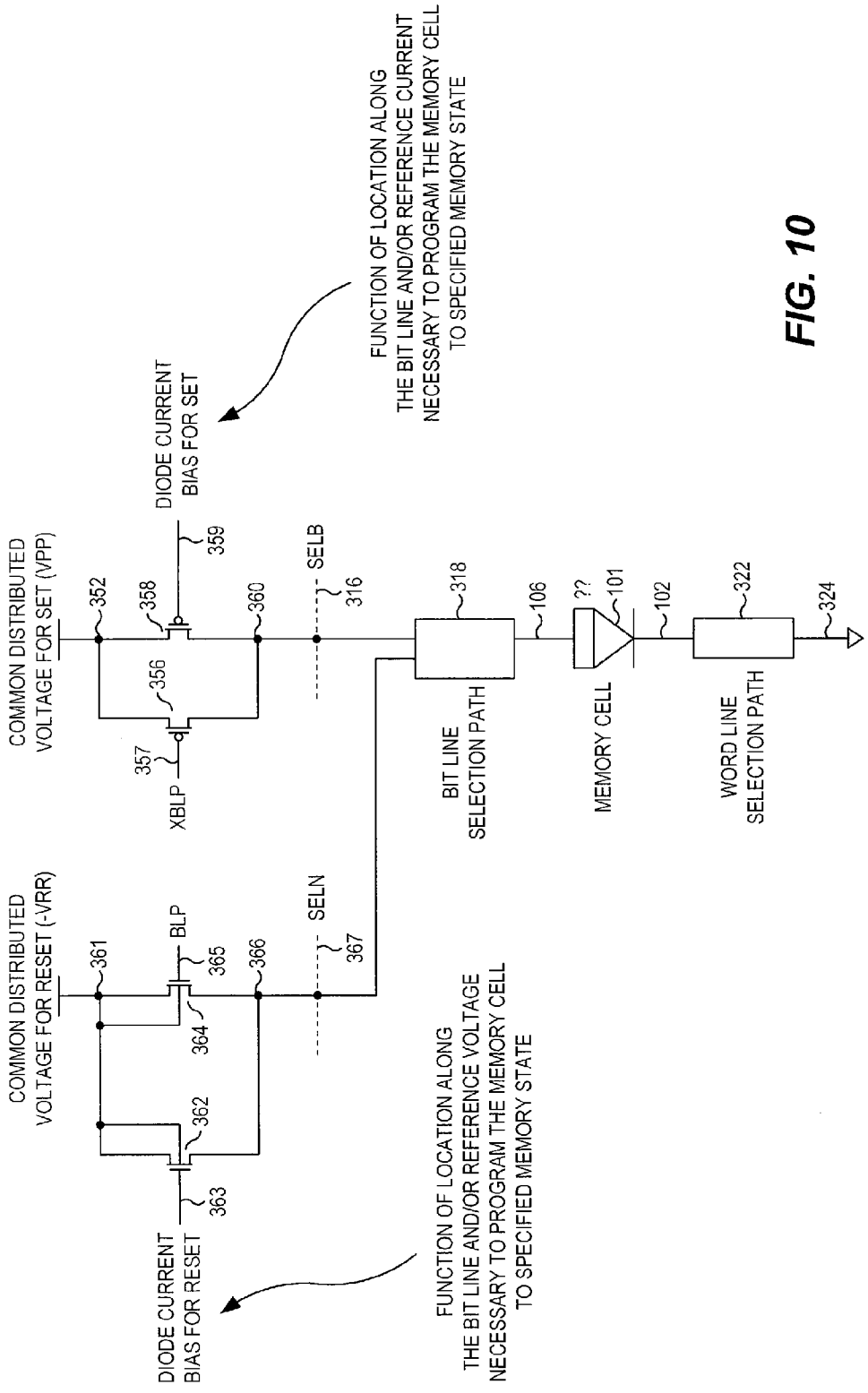
FIG. 10 is a schematic/block diagram of a write circuit useful for certain embodiments of the present invention.

FIG. 10 depicts an exemplary circuit topology 350 for writing a multi-level memory cell. In this circuit, both the voltage and current of the selected bit line are controlled to particular values. For forward bias (i.e., set) operation, a distributed supply node provides the desired voltage bias (VPP) on bus 352. A diode current bias signal 359 coupled to PMOS transistor 358 provides the desired current limit on the selected bit line 106. A precharge device 356 functions to precharge the selection path to enhance performance, responsive to an XBLP precharge signal 357. Both devices 356, 358 are coupled to node 360, which is coupled to an SELB bus 316. An analogous circuit supplies the reverse bias voltage and current to the bit line for the reverse bias (i.e., reset) programming. A distributed supply node provides the desired voltage bias (−VRR) on bus 361. A diode current bias signal 363 coupled to NMOS transistor 362 provides the desired current limit on the selected bit line. A precharge device 364 functions to precharge the selection path, responsive to a BLP precharge signal 365. Both devices 362, 364 are coupled to node 366 which is coupled to an SELN bus 367.

Multiple programming operations may be used to program the various resistance states as described with reference to FIG. 5 above, and as described in more detail in the MA-163-1 application, referenced below. The use of sloped programming pulses is described in the SAND-01114US0 and SAND-01114US1 applications, referenced below, and techniques for trimming the resistance of multiple cells is described in the SAND-01117US0 and SAND-011/7US1 applications, referenced below. The dual bit line source selection buses SELB and SELN are described in more detail in the 023-0051 and 023-0056 applications, referenced below. Additional insight into useful programming techniques maybe found in U.S. Pat. No. 6,952,030 referenced below.

Exemplary multi-level memory cells include a passive element cell having a metal oxide (e.g., a transition metal oxide) and a diode. Other suitable cells include those having a resistive material in a diode matrix. Examples include a programmable metallization connection, a phase change resistor such as GST material, an organic material variable resistor, a complex metal oxide, a carbon polymer film, a doped chalcogenide glass, and a Schottky barrier diode containing mobile atoms to change resistance. The resistive material chosen may provide one-time-programmable (OTP) memory cells, or write-many memory cells. In addition, a polysilicon diode could be employed having conduction modified by reverse bias stress.

Useful memory cells for reverse reset operation are described in U.S. Pat. No. 6,952,030 entitled "High-Density Three-Dimensional Memory Cell" to S. Brad Herner, et al.; and also in U.S. application Ser. No. 11/237,167 entitled "Method for Using a Memory Cell Comprising Switchable Semiconductor Memory Element with Trimmable Resistance" by Tanmay Kumar, et al., filed on Sep. 28, 2005, and published as U.S. Patent Application Publication No. 2007-0090425. A suitable metal oxide memory cell is shown in U.S. application Ser. No. 11/394,903 entitled "Multilevel Nonvolatile Memory Cell Comprising a Resistivity-Switching Oxide or Nitride and an Antifuse" by S. Brad Hemer, and filed on Mar. 31, 2006. A suitable memory cell using a phase change material, which can provide multiple resistance states, is shown in U.S. Patent Application Publication No. 2005-0158950 entitled "Non-Volatile Memory Cell Comprising a Dielectric Layer and a Phase Change Material in Series" by Roy E. Scheuerlein, et al. Each of these above-referenced disclosures is incorporated herein by reference in its entirety. Other exemplary memory cells having a transition-metal oxide (e.g., including those having cobalt), and exemplary cells in which the polysilicon material of the steering element itself comprises the switchable resistance material, are described in the MA-163-1 application referenced below.

In addition, U.S. application Ser. No. 11/125,939 entitled "Rewritable Memory Cell Comprising a Diode and a Resistance Switching Material" by S. Brad Hemer, et al., filed on May 9, 2005, and published as U.S. Patent Application Publication No. 2006-0250836, discloses a useful rewritable memory cell incorporating a diode in series with an oxide, such as a nickel oxide, in which the resistance of the memory cell may be repeatedly switched from low to high and from high to low resistance states. U.S. application Ser. No. 11/395,995 entitled "Nonvolatile Memory Cell Comprising a Diode and a Resistance Switching Material" by S. Brad Herner, et al., filed on Mar. 31, 2006 and published as U.S. Patent Application Publication No. 2006-0250837, discloses a OTP multi-level memory cell which is set using forward bias and reset using reverse bias. Each of these above-referenced disclosures is incorporated herein by reference in its entirety.

Exemplary multi-level memory cells are described in the aforementioned U.S. application Ser. No. 11/237,167, and in the MA-163-1 application, referenced below.

Exemplary passive element memory cells and related non-volatile memory structures which may be useful in practicing the present invention are described the following documents, each of which is incorporated herein by reference in its entirety:

U.S. Pat. No. 6,034,882 entitled "Vertically Stacked Field Programmable Nonvolatile Memory and Method of Fabrication" to Mark G. Johnson, et al.;

U.S. Pat. No. 6,420,215 entitled "Three Dimensional Memory Array and Method of Fabrication" to N. Johan Knall, et al.;

U.S. Pat. No. 6,525,953 entitled "Vertically-Stacked, Field Programmable, Nonvolatile Memory and Method of Fabrication" to Mark Johnson, et al.;

U.S. Pat. No. 6,490,218 entitled "Digital Memory Method and System for Storing Multiple-Bit Digital Data" to Michael Vyvoda, et al.;

U.S. Pat. No. 6,952,043 entitled "Electrically Isolated Pillars in Active Devices" to Michael Vyvoda, et al.; and U.S. Patent Application Publication No. US2005-0052915 entitled "Nonvolatile Memory Cell Without a Dielectric Antifuse Having High- and Low-Impedance States" by S. Brad Herner, et al.

The following applications, each filed on even date herewith, describe memory cell structures, circuits, systems, and methods that may be useful in practicing the present invention, each of which is incorporated herein by reference in its entirety:

U.S. application Ser. No. 11/496,985, now U.S. Publication No. 2007/0069276, entitled "Multi-Use Memory Cell and Memory Array" by Roy Scheuerlein and Tanmay Kumar (the "10519-141" application);

U.S. application Ser. No. 11/496,984, now U.S. Publication No. 2007/0070690, entitled "Method for Using a Multi-Use Memory Cell and Memory Array" by Roy Scheuerlein and Tanmay Kumar (the "10519-150" application);

U.S. application Ser. No. 11/496,874, now U.S. Publication No. 2008-0023790. entitled "Mixed-Use Memory Array" by Roy Scheuerlein (the "10519-142" application);

U.S. application Ser. No. 11/496,983, now U.S. Publication No. 2008-0025118, entitled "Method for Using a Mixed-Use Memory Array" by Roy Scheuerlein (the "10519-151" application);

U.S. application Ser. No. 11/496,870, now U.S. Publication No. 2008-0025069, entitled "Mixed-Use Memory Array With Different Data States" by Roy Scheuerlein and Christopher Petti (the "10519-149" application);

U.S. application Ser. No. 11/497,021, now U.S. Publication No. 2008-0025062, entitled "Method for Using a Mixed-Use Memory Array With Different Data States" by Roy Scheuerlein and Christopher Petti (the "10519-152" application);

U.S. application Ser. No. 11/461,393, now U.S. Publication No. 2008-0025076, entitled "Controlled Pulse Operations in Non-Volatile Memory" by Roy Scheuerlein (the "SAND-01114US0" application);

U.S. application Ser. No. 11/461,399, now U.S. Publication No. 2008-0025077, entitled "Systems for Controlled Pulse Operations in Non-Volatile Memory" by Roy Scheuerlein (the "SAND-01114US1" application);

U.S. application Ser. No. 11/461,410, now U.S. Publication No. 2008-0025061, entitled "High Bandwidth One-Time Field-Programmable Memory" by Roy Scheuerlein and Christopher J. Petti (the "SAND-01115US0" application);

U.S. application Ser. No. 11/461,419, now U.S. Publication No. 2008-0025067, entitled "Systems for High Bandwidth One-Time Field-Programmable Memory" by Roy Scheuerlein and Christopher J. Petti (the "SAND-01115US1" application);

U.S. application Ser. No. 11/461,424, now U.S. Publication No. 2008-0025068, entitled "Reverse Bias Trim Operations in Non-Volatile Memory" by Roy Scheuerlein and Tanmay Kumar (the "SAND-01117US0" application);

U.S. application Ser. No. 11/461,431, now U.S. Publication No. 2008-0025078, entitled "Systems for Reverse Bias Trim Operations in Non-Volatile Memory" by Roy Scheuerlein and Tanmay Kumar (the "SAND-01117US1" application);

U.S. application Ser. No. 11/496,986, now U.S. Publication No. 2007-0072360, entitled "Method for Using a Memory Cell Comprising Switchable Semiconductor Memory Element with Trimmable Resistance" by Tanmay Kumar, S. Brad Herner, Roy E. Scheuerlein, and Christopher J. Petti (the "MA-163-1" application);

U.S. application Ser. No. 11/461,339, now U.S. Publication No. 2008-0025066, entitled "Passive Element Memory Array Incorporating Reversible Polarity Word Line and Bit Line Decoders" by Luca G. Fasoli, Christopher J. Petti, and Roy E. Scheuerlein (the "023-0048" application);

U.S. application Ser. No. 11/461,364, now U.S. Publication No. 2008-0025132, entitled "Method for Using a Passive Element Memory Array Incorporating Reversible Polarity Word Line and Bit Line Decoders" by Luca G. Fasoli, Christopher J. Petti, and Roy E. Scheuerlein (the "023-0054" application);

U.S. application Ser. No. 11/461,343, now U.S. Publication No. 2008-0025088, entitled "Apparatus for Reading a Multi-Level Passive Element Memory Cell Array" by Roy E. Scheuerlein, Tyler Thorp, and Luca G. Fasoli (the "023-0049" application);

U.S. application Ser. No. 11/461,367, now U.S. Publication No. 2008-0025089, entitled "Method for Reading a Multi-Level Passive Element Memory Cell Array" by Roy E. Scheuerlein, Tyler Thorp, and Luca G. Fasoli (the "023-0055" application);

U.S. application Ser. No. 11/461,352, now U.S. Publication No. 2008-0025131, entitled "Dual Data-Dependent Busses for Coupling Read/Write Circuits to a Memory Array" by Roy E. Scheuerlein and Luca G. Fasoli (the "023-0051" application);

U.S. application Ser. No. 11/461,369, now U.S. Publication No. 2008-0025133, entitled "Method for Using Dual Data-Dependent Busses for Coupling Read/Write Circuits to a Memory Array" by Roy E. Scheuerlein and Luca G. Fasoli (the "023-0056" application);

U.S. application Ser. No. 11/461,359, now U.S. Publication No. 2008-0025085, entitled "Memory Array Incorporating Two Data Busses for Memory Array Block Selection" by Roy E. Scheuerlein, Luca G. Fasoli, and Christopher J. Petti (the "023-0052" application);

U.S. application Ser. No. 11/461,372, now U.S. Publication No. 2008-0025134, entitled "Method for Using Two Data Busses for Memory Array Block Selection" by Roy E. Scheuerlein, Luca G. Fasoli, and Christopher J. Petti (the "023-0057" application);

U.S. application Ser. No. 11/461,362, now U.S. Publication No. 2008-0025093, entitled "Hierarchical Bit Line Bias Bus for Block Selectable Memory Array" by Roy E. Scheuerlein and Luca G. Fasoli (the "023-0053" application); and U.S. application Ser. No. 11/461,376, now U.S. Publication No. 2008-0025094, entitled "Method for Using a Hierarchical Bit Line Bias Bus for Block Selectable Memory Array" by Roy E. Scheuerlein and Luca G. Fasoli (the "023-0058" application).

Preferably the memory array includes a segmented word line architecture, and preferably a 3D array. In certain embodiments, the word lines on a given word line layer are associated with bit lines on a single bit line layer, while in certain embodiments the word lines on a given word line layer are shared between two bit line layers (i.e., a single word line layer and two bit line layers defining two memory planes) in a so-called "half-mirrored" arrangement. Such a memory array structure is described further in U.S. Pat. No. 6,879,505, the disclosure of which is hereby incorporated by reference in its entirety.

It should be appreciated that the designations top, left, bottom, and right are merely convenient descriptive terms for the four sides of a memory array. The word line segments for a block may be implemented as two inter-digitated groups of word line segments oriented horizontally, and the bit lines for a block may be implemented as two inter-digitated groups of bit lines oriented vertically. Each respective group of word lines or bit lines may be served by a respective decoder/driver circuit and a respective sense circuit on one of the four sides of the array.

Suitable column and row circuits, including hierarchical levels of such decoding, bias circuit organization for the decoded busses, and related supporting circuits, are described in U.S. Pat. No. 6,856,572 by Roy E. Scheuerlein and Matthew P. Crowley, entitled "Multi-Headed Decoder Structure Utilizing Memory Array Line Driver with Dual Purpose Driver Device"; in U.S. Pat. No. 6,859,410 by Roy E. Scheuerlein and Matthew P. Crowley, entitled "Tree Decoder Structure Particularly Well-Suited to Interfacing Array Lines Having Extremely Small Layout Pitch"; in "Dual-Mode Decoder Circuit, Integrated Circuit Memory Array Incorporating Same, and Related Methods of Operation" by Kenneth K. So, et al., U.S. application Ser. No. 11/026,493 filed Dec. 30, 2004, now U.S. Pat. No. 7,298,665; and in "Apparatus and Method for Hierarchical Decoding of Dense Memory Arrays Using Multiple Levels of Multiple-Headed Decoders," by Luca G. Fasoli, et al., U.S. Patent Application Publication No. 2006-0146639 A1, now U.S. Pat. No. 7,286,439. The disclosure of each of these enumerated documents is hereby incorporated by reference in its entirety. Moreover, additional useful column and row selection circuits are described in the 023-0048 and 023-0054 applications, in the 023-0051 and 023-0056 applications, in the 023-0052 and 023-0057 applications, and in the 023-0053 and 023-0058 applications, all referenced herein above.

Non-mirrored memory arrays (e.g., a word line layer associated with only a single bit line layer) are described in U.S. application Ser. No. 11/095,907 filed Mar. 31, 2005, by Luca G. Fasoli, et al., entitled "Method and Apparatus for Incorporating Block Redundancy in a Memory Array", now U.S. Pat. No. 7,142,471, the disclosure of which is hereby incorporated by reference in its entirety.

As used herein, a row extends across the entire memory bay (if not across the entire stripe) and includes many word lines. As used herein a bus or line which is "generally spanning the plurality of array blocks" includes spanning almost all the array blocks, such as spanning all but the last block (e.g., a last block to which a given bus is not coupled to). As used herein, "coupling selected bit lines to a first bus" means respectively coupling each such selected bit line to a corresponding bus line of the first bus. As used herein, word lines (e.g., including word line segments) and bit lines usually represent orthogonal array lines, and generally follow a common assumption in the art that word lines are driven and bit lines are sensed, at least during a read operation. Moreover, as used herein, a "global line" (e.g., a global select line) is an array line that spans more than one memory block, but no particular inference should be drawn suggesting such a global line must traverse across an entire memory array or substantially across an entire integrated circuit. As used herein, "sensing a current relative to a reference current" is taken to mean determining if the "sensed" current is greater or less than the reference current.

As used herein, a passive element memory array includes a plurality of 2-terminal memory cells, each connected between an associated X-line (e.g., word line) and an associated Y-line (e.g., bit line). Such a memory array may be a two-dimensional (planar) array or may be a three-dimensional array having more than one plane of memory cells. Each such memory cell has a non-linear conductivity in which the current in a reverse direction (i.e., from cathode to anode) is lower than the current in a forward direction. A passive element memory array may be a one-time programmable (i.e., write once) memory array or a read/write (i.e., write many) memory array.

Such passive element memory cells may generally be viewed as having a current steering element directing current in a direction and another component which is capable of changing its state (e.g., a fuse, an antifuse, a capacitor, a resistive element, etc.). The programming state of the memory element can be read by sensing current flow or voltage drop when the memory element is selected.

The directionality of various array lines in the various figures is merely convenient for ease of description of the two groups of crossing lines in the array. As used herein, an integrated circuit memory array is a monolithic integrated circuit structure, rather than more than one integrated circuit device packaged together or in close proximity.

In the interest of clarity, not all of the routine features of the implementations described herein are shown and described. The block diagrams herein may be described using the terminology of a single node connecting the blocks. Nonetheless, it should be appreciated that, when required by the context, such a "node" may actually represent a pair of nodes for conveying a differential signal, or may represent multiple separate wires (e.g., a bus) for carrying several related signals or for carrying a plurality of signals forming a digital word or other multi-bit signal.

While circuits and physical structures are generally presumed, it is well recognized that in modern semiconductor design and fabrication, physical structures and circuits may be embodied in computer readable descriptive form suitable for use in subsequent design, test or fabrication stages as well as in resultant fabricated semiconductor integrated circuits. Accordingly, claims directed to traditional circuits or structures may, consistent with particular language thereof, read upon computer readable encodings and representations of same, whether embodied in media or combined with suitable reader facilities to allow fabrication, test, or design refinement of the corresponding circuits and/or structures. The invention is contemplated to include circuits, related methods or operation, related methods for making such circuits, and computer-readable medium encodings of such circuits and methods, all as described herein, and as defined in the appended claims. As used herein, a computer-readable medium includes at least disk, tape, or other magnetic, optical, semiconductor (e.g., flash memory cards, ROM), or electronic medium and a network, wireline, wireless or other communications medium. An encoding of a circuit may include circuit schematic information, physical layout information, behavioral simulation information, and/or may include any other encoding from which the circuit may be represented or communicated.

The foregoing details description has described only a few of the many possible implementations of the present invention. For this reason, this detailed description is intended by way of illustration, and not by way of limitations. Variations and modifications of the embodiments disclosed herein may be made based on the description set forth herein, without departing from the scope and spirit of the invention. It is only the following claims, including all equivalents, that are intended to define the scope of this invention. Moreover, the embodiments described above are specifically contemplated to be used alone as well as in various combinations. Accordingly, other embodiments, variations, and improvements not described herein are not necessarily excluded from the scope of the invention.

What is claimed is:

1. A method for reading a multi-level passive element memory cell having first, second, third, and fourth memory cell states corresponding respectively to first, second, third, and fourth decreasing resistance levels, said method comprising:
   discriminating between memory cell states by sensing current on a selected bit line for at least two different combinations of reference current level and read bias voltage on the selected bit line.

2. The method of claim 1 further comprising:
   associating the first and fourth memory cell states with one value of a first data bit, and associating the second and third memory cell states with the other value of the first data bit; and
   associating the first and second memory cell states with one value of a second data bit, and associating the third and fourth memory cell states with the other value of the second data bit.

3. The method of claim 2 wherein:
   the first data bit comprises a most significant bit (MSB) and the second data bit comprises a least significant bit (LSB); and
   the first, second, third, and fourth memory cell states correspond respectively to data states 11, 01, 00, and 10.

4. The method of claim 2 wherein:
   the first and second data bits are associated with separate user operations.

5. The method of claim 4 wherein:
   the first and second data bits correspond to separate memory pages.

6. The method of claim 1 further comprising:
   discriminating between memory cell states by sensing current on the selected bit line relative to at least two different reference current levels.

7. The method of claim 6 further comprising:
   biasing a selected bit line with a read bias voltage;
   sensing the selected bit line current relative to a first reference current level and relative to a second reference current level; and
   generating a read data value for a first data bit as a function of the sensed current on the selected bit line current relative to the first and second reference current levels.

8. The method of claim 7 further comprising:
   simultaneously sensing the selected bit line current relative to the first and second reference current levels.

9. The method of claim 7 wherein the generating a read data value comprises:
   generating a first read data value for the first data bit if the sensed selected bit line current is between the first and second reference current levels, and generating a second read data value for the first data bit if the sensed selected bit line current is outside the first and second reference current levels.

10. The method of claim 1 further comprising:
    discriminating between memory cell states by sensing current on the selected bit line for at least two different read bias voltages on the selected bit line.

11. The method of claim 10 further comprising:
    biasing, at respective times, a selected bit line with a first read bias voltage and a second read bias voltage;
    sensing, for each of the first and second read bias voltages, the current on the selected bit line relative to a respective reference current level; and generating a read data value for a first data bit as a function of the sensed current on the selected bit line for the first and second read bias voltages.

12. The method of claim 11 wherein:
the respective reference current levels corresponding to the first and second read bias voltages are substantially identical in value.

13. A method for reading a multi-level passive element memory cell having first, second, third, and fourth memory cell states corresponding respectively to first, second, third, and fourth decreasing resistance levels, said method comprising:
biasing a selected bit line with a read bias voltage;
biasing a selected word line with a selected word line voltage;
generating a first signal and a second signal indicative respectively of a current on the selected bit line relative to a first reference current level and relative to a second reference current level; and
generating a read data value for a first data bit as a function of the first and second signals.

14. The method of claim 13 further comprising:
simultaneously generating the first and second signals.

15. The method of claim 13 wherein the generating a read data value comprises:
generating a first read data value for the first data bit if the first and second signals correspond to the sensed selected bit line current being between the first and second reference current levels, and generating a second read data value for the first data bit if the first and second signals correspond to the sensed selected bit line current being outside the first and second reference current levels.

16. The method of claim 15 wherein:
the first and second reference current levels correspond respectively to a midpoint between the first and second resistance states, and to a midpoint between the third and fourth resistance states.

17. The method of claim 13 further comprising:
generating a third signal indicative of a current on the selected bit line relative to a third reference current level; and
generating a read data value for a second data bit as a function of the third signal.

18. The method of claim 17 wherein said generating a read data value for a second data bit comprises:
generating a first read data value for the second data bit if the third signal corresponds to the sensed selected bit line current being less than the third reference current level, and generating a second read data value for the second data bit if the third signal corresponds to the sensed selected bit line current being greater than the third reference current level.

19. The method of claim 18 wherein:
the third current level corresponds to a midpoint between the second and third resistance states.

20. A method for reading a multi-level passive element memory cell having first, second, third, and fourth memory cell states corresponding respectively to first, second, third, and fourth decreasing resistance levels, said method comprising:
biasing a selected word line with a selected word line voltage;
biasing a selected bit line with a first read bias voltage;
generating a first signal indicative of the current on the selected bit line, when biased at the first read bias voltage, relative to a first reference current level;
biasing the selected bit line with a second read bias voltage;
generating a second signal indicative of the current on the selected bit line, when biased at the second read bias voltage, relative to a second reference current level; and
determining a read data value for a first data bit as a function of the first and second signals.

21. The method of claim 20 wherein:
the first and second reference current levels are substantially identical in value.

22. The method of claim 20 wherein:
the first read bias voltage is higher than the second read bias voltage, and the first reference current level is lower or equal to the second reference current level.

23. The method of claim 20 wherein:
the first read bias voltage is higher than the second read bias voltage; and
said determining a read data value for a first data bit comprises
generating a first read data value for the first data bit if the first and second signals correspond to the sensed selected bit line current being less than the second reference current, and further correspond to the sensed selected bit line current being greater than the first reference current; and
generating a second read data value for the first data bit otherwise.

24. The method of claim 20 further comprising:
biasing the selected bit line with a third read bias voltage;
generating a third signal indicative of the current on the selected bit line relative to a third reference current level;
determining a read data value for a second data bit as a function of the third signal.

25. The method of claim 24 wherein:
the first and second data bits are associated with separate user operations.

26. The method of claim 24 wherein:
the first, second, and third reference current levels are substantially identical in value.

27. A method for making a memory product, said method comprising:
forming a memory array comprising multi-level passive element memory cells having first, second, third, and fourth memory cell states corresponding respectively to first, second, third, and fourth decreasing resistance levels;
forming a data circuit configured to discriminate between memory cell states by sensing current on a selected bit line for at least two different combinations of reference current level and read bias voltage on the selected bit line.

28. The method of claim 27 wherein:
the first and fourth memory cell states are associated with one value of a first data bit, and the second and third memory cell states are associated with the other value of the first data bit; and
the first and second memory cell states are associated with one value of a second data bit, and the third and fourth memory cell states are associated with the other value of the second data bit.

29. The method of claim 28 wherein:
the first data bit comprises a most significant bit (MSB) and the second data bit comprises a least significant bit (LSB); and
the first, second, third, and fourth memory cell states correspond respectively to data states 11, 01, 00, and 10.

30. The method of claim 28 wherein:
the first and second data bits are associated with separate user operations.

31. The method of claim 30 wherein:
the first and second data bits correspond to separate memory pages.

32. The method of claim 27 further comprising:
forming a data circuit configured to sense current on the selected bit line relative to at least two different reference current levels.

33. The method of claim 27 further comprising:
forming a data circuit configured to sense current on the selected bit line for at least two different read bias voltages on the selected bit line.

34. The method of claim 27 wherein the memory product comprises a packaged module.

* * * * *